United States Patent [19]
Ota et al.

[11] Patent Number: 5,337,399
[45] Date of Patent: Aug. 9, 1994

[54] WAVELENGTH CONVERSION ELEMENT

[75] Inventors: Hiroyuki Ota; Kiyofumi Chikuma, both of Iruma, Japan

[73] Assignee: Pioneer Electronic Corporation, Tokyo, Japan

[21] Appl. No.: 800,122

[22] Filed: Nov. 29, 1991

[30] Foreign Application Priority Data

Dec. 6, 1990 [JP] Japan .................. 2-400705

[51] Int. Cl.⁵ ................. G02B 6/02; H03F 7/00
[52] U.S. Cl. ..................... 385/122; 385/14; 359/326
[58] Field of Search ........... 385/122, 12, 27, 14; 359/326, 328, 332

[56] References Cited

U.S. PATENT DOCUMENTS

| | | | |
|---|---|---|---|
| 3,877,052 | 4/1975 | Dixon et al. | 385/33 X |
| 3,980,392 | 9/1976 | Auracher | 385/28 X |
| 4,715,672 | 12/1987 | Duguay et al. | 385/129 |
| 4,991,931 | 2/1991 | Harada et al. | 385/122 X |
| 5,011,250 | 4/1991 | Okada et al. | 385/122 X |
| 5,013,129 | 5/1991 | Harada et al. | 385/122 X |
| 5,028,107 | 7/1991 | Bierlein et al. | 385/122 X |
| 5,091,984 | 2/1992 | Kobayashi et al. | 385/16 |
| 5,096,277 | 3/1992 | Kleinerman | 385/12 |

*Primary Examiner*—Akm E. Ullah
*Attorney, Agent, or Firm*—Sughrue, Mion, Zinn, Macpeak & Seas

[57] ABSTRACT

A wavelength conversion element comprises a laser oscillation portion provided with an active layer waveguide formed of a material of III–V group in a periodic table and an output waveguide path portion provided with an output waveguide. The output waveguide path portion is further provided with a buffer layer between the output waveguide and the active layer waveguide having a thickness suitable for propagation of an evanecsent wave from the active layer waveguide to the output waveguide. In result, a wavelength conversion efficiency of a second harmonic can be remarkably improved, and a process of manufacturing the wavelength conversion element becomes more easy.

9 Claims, 2 Drawing Sheets

WAVELENGTH CONVERSION ELEMENT

BACKGROUND OF THE INVENTION

This invention relates to a wavelength conversion element, and more particularly to a wavelength conversion element utilizing a non-linear optical material.

FIG. 2 shows a wavelength conversion element 100 equipped with a Fabry-Perot resonator for achieving high output realization of SHG (second-harmonic generation).

Such a conventional wavelength conversion element 100 is composed of a resonator 120 utilizing a so-called semiconductor laser of III-V group in the periodic table and a thin film 140 (or super lattice) made of a material such as ZnS/ZnSe of II-VI group in the periodic table which is attached to one longitudinal end of the resonator 120. Reflecting films 151,155 are disposed to the other longitudinal end of the resonator 120 and the front side of the thin film 140, and a waveguide path 125 formed of a material such as GaAlAs/GaAs of III-V group in the periodic table is formed in the resonator along the longitudinal direction thereof.

When an electric current is injected in the waveguide path 125 of the resonator 120 thus formed, near infrared rays are oscillated and the oscillated light is propagated in the waveguide path 125 and reaches the thin film 140 attached to the one end of the resonator 120. The semiconductor of II-VI group has the SHG activation, which carrys out wavelength conversion of the near infrared rays amplified by the resonator to thereby generate coherent light of blue color. In such an operation, it is necessary to select a thickness (or mutual operative length L1) of the thin film 140 so as to satisfy the resonating condition with respect to the oscillated light for the reason that a large wave-conversion efficiency is expected by satisfying a phase matching.

In view of the foregoing, in the conventional technology described above, the phase matching has been carried out by utilizing the II-VI group semiconductor thin film 140 having the mutual operative length L1 such as 600 nm being shorter than the coherent light length.

However, an output $P_{2W}$ of a second harmonic subjected to the wavelength conversion is expressed by a following function related to a non-linear optical constant $\alpha$, an output $P_W$ of a fundamental (or primary) light and the mutual operative length L.

$$P_{2W} = \alpha^2 P_W^2 L^2 \tag{1}.$$

That is, the wavelength conversion efficiency is proportional to the squares of the non-linear optical constant $\alpha$, the output $P_W$ of a fundamental (or primary) light and the mutual operative length L, respectively. Accordingly, the conventional wavelength conversion element 100 of the type described above has a defect of not obtaining a remarkable wavelength conversion efficiency because the mutual operative length L is too short. Furthermore, the thin film 140 of the material of II-VI group is disposed to the longitudinal end of the III-V group semiconductor laser resonator, so that a process for producing a thin film 140 due to crystal growth is made complicated and a good yield is not expected, thus being inconvenient.

SUMMARY OF THE INVENTION

An object of this invention is to substantially eliminate defects or drawbacks encountered in the prior art and to provide a wavelength conversion element capable of attaining a remarkable conversion efficiency of the second harmonic and being easily produced with high yielding.

This and other objects can be achieved according to this invention by providing a wavelength conversion element comprising a laser oscillation portion provided with an active layer waveguide formed of a material of III-V group in a periodic table and an output waveguide path portion provided with an output waveguide which is to be coupled with the active layer waveguide by an evanescent wave leaking from the active layer waveguide.

In preferred embodiments, the output waveguide path portion includes buffer layer between the active layer waveguide and the output waveguide, the buffer layer having a thickness suitable for propagation of the evanescent were so as to leak from the active layer waveguide to the output waveguide. The active layer waveguide includes a material of GaAs, the output waveguide includes a material of ZnS or ZnSe and the buffer layer includes a material of $SiO_2$, GaAs of GaAlAs. The output waveguide has a thickness set so that a propagation speed of a non-linear polarization wave excited by the evanescent wave in the output waveguide accords with a propagation speed of a second harmonic excited and generated by the non-linear polarization wave in the output waveguide.

The wavelength conversion element further includes a laser oscillation portion and an output waveguide path portion to be coupled with the laser oscillation portion, the laser oscillation portion comprising an active layer waveguide formed of a material of III-IV group in the periodic table, first and second clad layers between which the active layer waveguide is disposed, reflecting films provided at both end surfaces of the active layer waveguide and first and second clad layers perpendicular to a wave guiding direction, and electrodes attached to surfaces of the first and second clad layers, and the output waveguide path portion comprising a substrate, an output waveguide formed of a material of II-VI group and disposed on said substrate, and a buffer layer disposed on the output waveguide, the buffer layer being coupled with one of the first and second clad layers and the buffer layer having a thickness suitable for propagation of an evanescent wave so as to leak from the active layer waveguide to the output waveguide.

The active layer waveguide has a refractive index larger than refrective indexes of the first and second clad layers.

According to the wavelength conversion element of this invention, the evanescent wave leaking from the active layer waveguide excites the non-liner polarization wave from the semiconductor material of II-VI group in the output waveguide and then generates the second harmonic having a large conversion efficiency.

DESCRIPTION OF THE PREFERRED EMBODIMENT

This invention eliminates the defects and drawbacks of the conventional technology and will be described hereunder with reference to FIG. 1.

Figure 1:
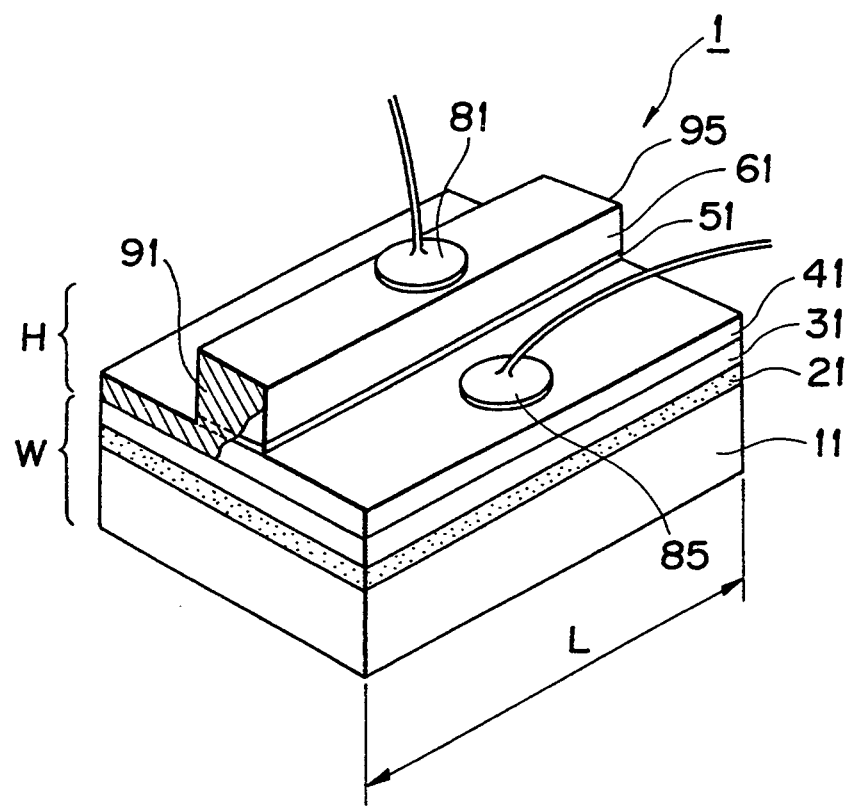
FIG. 1 is a schematic perspective view showing one embodiment of a wavelength conversion element according to this invention.
Figure 2:
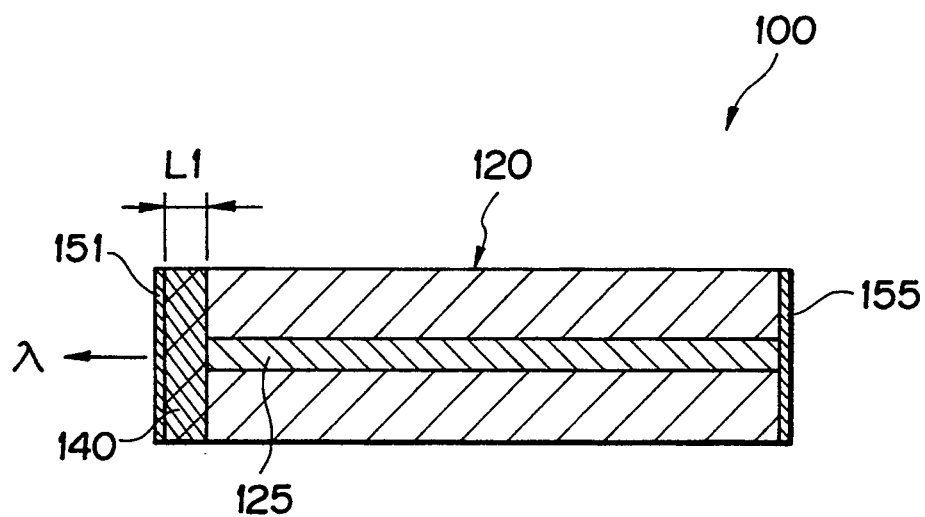
FIG. 2 is a sectional illustration of a conventional wavelength conversion element provided with a Fabry-Perot resonator.

Referring to FIG. 1, reference numeral 1 denotes a wavelength conversion element which generally composed of a laser oscillation portion H and an output waveguide path W. The laser oscillation portion H comprises a Fabry-Perot resonator provided with fully reflecting mirrors. That is, the laser oscillation portion H is composed of an active layer waveguide 51 for light emission and clad layers 41 and 61 between which the active layer waveguide 51 is interposed. Reflecting films 91 and 95 are disposed on both longitudinal end surfaces of these active layer waveguide 51 and the clad layers 41 and 61 perpendicular to a wave guiding direction, and electrodes 81 and 85 are secured to the surfaces of the clad layers 41 and 61, respectively.

In this embodiment, the active layer waveguide 51 for light emission is formed of a material such as GaAs of III–V group in the periodic table, which is sandwiched between p-type and n-type clad layers 41 and 61 formed of materials such as GaAlAs of III–V group in the periodic table. The active layer waveguide 51 has a refractive index larger than those of the clad layers 41 and 61 by about 5% and also has a thickness of 0.1 μm. A light emitted in the active layer waveguide 51 is guided along the active layer waveguide 51 with a width of about 1 μm. A voltage corresponding to a width of a forbidden band of the active layer waveguide 51 is applied for the injection of the carrier, and this voltage is of about 0.7 to 1.5 V.

The output waveguide path W is composed of a substrate 11, an output waveguide 21 for generating second-harmonic disposed on the substrate 11 and a buffer layer 31 further disposed on the output waveguide 21, and the buffer layer 31 is bonded to the clad layer 41 of the laser oscillation portion H. That is, the buffer layer 31 is sandwiched between the output waveguide 21 of the output waveguide path W and the clad layer 41 of the laser oscillation portion H.

The output waveguide 21 for generating second-harmonic is formed of a semiconductor material of II–VI group having SHG activity such as ZnS and ZnSe and coupled with the active layer waveguide 51 by an evanescent wave, so-called evanescent coupling. This evanescent coupling is one kind of coupling method in which boundary surfaces of first and second mediums, having high refractive indexes and contacted to each other through a medium having an extremely thin thickness and low reflective index, are coupled by transferring energy from the first medium to the second medium through the evanescent wave. That is, the evanescent wave leaking from the active layer waveguide 51 of the material of III–V group excites the semiconductor material of II–VI group to generate a non-linear polarization wave, thus producing the second harmonic.

The film thickness of the output waveguide 21 is set so that a propagation speed of the non-linear polarization wave excited by the evanescent wave in the material of II–VI group accords with a propagation speed for propagating the second harmonic excited and generated by the non-linear polarization wave. This is based on the fact that, in order to achieve not only the wavelength conversion in the waveguide but also a high wavelength conversion efficiency, it is necessary to satisfy the phase matching condition. That is, in a case where the propagation speed of the non-linear polarization wave excited by the primary light accords with the propagation speed of the second harmonic generated by this non-linear polarization wave, the phase relationship between the non-linear polarization wave and the second harmonic is constant at arbitrary position of the output waveguide 21 in the longitudinal direction. This condition may be regarded as "phase matching is achieved", and under such condition, the phase of the second harmonic generated at a certain position A and propagated to a certain position B accords with the phase of another second harmonic which has being just generated at the position B by the non-linear polarization, and hence, the wave motions are overlapped to increase the oscillation. On the contrary, in a case where the phase matching condition is not satisfied, the wave motions are overlapped to decrease the oscillation, thus obtaining no high wavelength conversion efficiency.

The buffer layer 31 is disposed as occasion demands, and the buffer layer 31 has a film thickness and is made of a material suitable for the coupling of the active layer waveguide 51 with the output waveguide 21 by means of the evanescent wave. That is, the buffer layer 31 is made of a material having thin thickness and low refractive index, such as $SiO_2$, GaAs and GaAlAs. The substrate will be made of a material such as GaAs and ZnS.

As described hereinbefore, by providing the output waveguide of the material of II–VI group in the periodic table coupled by the evanescent wave along the active layer waveguide of the III–V group semiconductor laser, the mutual operative length L in the equation (1) "$P_{2W} = \alpha^2 P_W^2 L^2$" can be made longer and the wavelength conversion efficiency of the second harmonic can be remarkably improved.

In the above embodiment, the length of the active layer waveguide 51 of the laser oscillation portion H is constructed to be equal to that of the output waveguide 21, but the later may be made longer than the former.

Such waveguide conversion element can be manufactured by known methods such as gas-phase or liquid-phase epitaxial growth method, deposition method, ion exchanging method, heat diffusion method and ion implantation method.

What is claimed is:
1. A wavelength conversion element comprising:
a laser oscillation portion comprising an active layer waveguide formed of a material of III–V group in a periodic table; and
an output waveguide path portion comprising an output waveguide layer which is disposed adjacent to said active layer waveguide, and which is coupled with said active layer waveguide by an evanescent wave leaking from said active layer waveguide, and a buffer layer disposed between said active layer waveguide and said output waveguide layer, said buffer layer having a thickness suitable for propagation of the evanescent wave from said active layer waveguide to said output waveguide, wherein said active layer waveguide comprises a material of GaAs, said output waveguide layer comprises a material of ZnS or ZnSe, and said buffer layer comprises a material of SiO₂, GaAs or GaAlAs.

2. A waveguide conversion element comprising:
a laser oscillation portion comprising an active layer waveguide formed of a material of III–V group in a periodic table; and
an output waveguide path portion comprising an output waveguide layer disposed adjacent to said active layer waveguide, and a buffer layer disposed between said output waveguide and said active layer waveguide, said buffer layer having a thickness suitable for propagation of an evanescent wave from said active layer waveguide to said output waveguide, said buffer layer including material of $SiO_2$, GaAs or GaAlAs, wherein said output waveguide layer has a thickness set so that a propagation speed of a non-linear polarization wave excited by the evanescent wave in the output waveguide layer corresponds to a propagation speed of a second harmonic excited and generated by the non-linear polarization wave in the output waveguide layer.

3. A wavelength conversion element according to claim 2, wherein said active layer waveguide comprises a material of GaAs, and said output waveguide comprises a material of ZnS or ZnSe.

4. A wavelength conversion element comprising:
a laser oscillation portion; and
an output waveguide path portion coupled with the laser oscillation portions.
said laser oscillation portion comprising an active layer waveguide formed of a material of III–V group in a periodic table, first and second clad layers between which said active layer waveguide is disposed, reflecting films provided at both end surfaces of the active layer waveguide and first and second clad layers perpendicular to a wave guiding direction, and electrodes attached to surfaces of said first and second clad layers, respectively and
said output waveguide path portion comprising a substrate, an output waveguide formed of a material of II–VI group in the periodic table and disposed on said substrate, and a buffer layer disposed on said output waveguide, said buffer layer being coupled with one of said first and second clad layers and said buffer layer having a thickness suitable for propagation of an evanescent wave from the active layer waveguide to the output waveguide.

5. A wavelength conversion element according to claim 4, wherein said output waveguide has a thickness set so that a propagation speed of a non-linear polarization wave excited by the evanescent wave in the output waveguide corresponds to a propagation speed of a second harmonic excited and generated by the non-linear polarization wave in the output waveguide.

6. A wavelength conversion element according claim 4, wherein said active layer waveguide comprises a material of GaAs, said output waveguide comprises a material of ZnS or ZnSe and said buffer layer comprises a material of $SiO_2$, GaAs or GaAlAs.

7. A wavelength conversion element according to claim 4, wherein said active layer waveguide having a refractive index larger than refrective indexes of said first and second clad layers.

8. A wavelength conversion element according to claim 4, wherein said first and second clad layers being primarily formed of materials of III–V group in the periodic table.

9. A wavelength conversion element according to claim 4, wherein said active layer waveguide comprises a material of GaAs, said output waveguide comprises a material of ZnS or ZnSe and said buffer layer comprises a material of $SiO_2$, GaAs or GaAlAs, said first and second clad layers being primarily formed of materials of the III–V group in the periodic table, and said output waveguide having a thickness set so that a propagation speed of non-linear polarization wave excited by the evanescent wave in the output waveguide corresponds to a propagation speed of a second harmonic excited and generated by the non-linear polarization wave in the output waveguide.

* * * * *